(12) United States Patent
Krusell (10) Patent No.: US 6,459,253 B1
(45) Date of Patent: Oct. 1, 2002

(54) BANDWIDTH CALIBRATION FOR FREQUENCY LOCKED LOOP

(75) Inventor: Göran Krusell, Lindingo (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 86 days.

(21) Appl. No.: 09/655,365

(22) Filed: Sep. 5, 2000

(51) Int. Cl.⁷ .............................................. G01R 23/12
(52) U.S. Cl. ................................ 324/76.53; 324/158.1; 327/107; 331/25; 455/260
(58) Field of Search ........................ 324/76.53, 73.1, 324/76, 77, 158.1, 548, 765; 331/16, 17, 78, 1 A, 25; 327/107, 106, 159; 714/715; 375/371–375; 455/260, 264

(56) References Cited

U.S. PATENT DOCUMENTS

| | | | |
|---|---|---|---|
| 4,309,674 A | | 1/1982 | Owen |
| 4,864,253 A | | 9/1989 | Zwack |
| 5,295,079 A | * | 3/1994 | Wong ........................ 714/715 |
| 5,631,587 A | * | 5/1997 | Co ............................ 327/107 |
| 5,703,539 A | * | 12/1997 | Gillig ......................... 331/16 |
| 5,839,059 A | * | 11/1998 | Hakkinen .................. 455/115 |
| 6,049,255 A | * | 4/2000 | Hagberg .................... 331/17 |

FOREIGN PATENT DOCUMENTS

| | | |
|---|---|---|
| EP | 1 079 514 A | 2/2001 |
| GB | 2 337 884 A | 12/1999 |

* cited by examiner

Primary Examiner—Michael Sherry
Assistant Examiner—Trung Nguyen
(74) Attorney, Agent, or Firm—Nixon & Vanderhye, P.C.

(57) ABSTRACT

A node (20) of a communications network extracts a reference signal from a transport network for use as a reference signal for the node. The node comprises a frequency locked loop (22) which filters the reference signal to the node, as well as a calibration system (24) which determines a tuning sensitivity factor (a) for the frequency locked loop. The calibration system performs a calibration procedure which includes the calibration steps of (1) obtaining a first error measurement (f1) when a first tuning data value is applied to the frequency locked loop; (2) obtaining a second error measurement (f2) when a second tuning data value is applied to the frequency locked loop; and, (3) using the first tuning data value, the second tuning data value, the first error measurement, and the second error measurement to determine the tuning sensitivity factor for the frequency locked loop. Determining the tuning sensitivity factor for the frequency locked loop involves determining a tuning slope by dividing a difference of the first error measurement and the second error measurement by a difference of the first tuning data value and the second tuning data value.

16 Claims, 10 Drawing Sheets

BANDWIDTH CALIBRATION FOR FREQUENCY LOCKED LOOP

BACKGROUND

1. Field of the Invention

The present invention pertains to frequency locked loops, and particularly to calibrating loop bandwidth for a frequency locked loop.

2. Related Art and Other Considerations

Digital communications is an example of a technology which requires high quality reference signals. For example, a reference signal such as a timing or clock signal, generated externally to a node of a digital communications network (e.g., a node of a telecommunications network), can be applied over a transport network to the node. At the node the reference signal is extracted and used as a reference source or reference signal for the node.

Traditionally a frequency locked loop, functioning as a narrow bandwidth low pass filter, has been used to extract the reference signal for a digital communications node. Often the frequency locked loop has a primarily digital implementation. Two important parameters of a frequency locked loop are settling time and attenuation of jitter and wander. Both jitter and wander are undesired frequency modulation in the reference signal, jitter typically being above 10 Hz and wander usually being below 10 Hz. Such undesired modulation can be caused by various phenomena, such as cross-talk and temperature changes, for example.

In a frequency locked loop, a short settling time is usually desired, which typically involves a wide loop bandwidth. On the other hand, there is the competing demand to attenuate jitter and wander, which attenuation requires a low modulation bandwidth. The tension between shortening settling time and attenuating jitter and wander generally leads to a compromise for modulation bandwidth. The compromise often introduces substantial margins for which allowances must regrettably be made.

It is known to calibrate signal generators, such as the model HP8645 signal generator and the model HP8656 signal generator manufactured by Hewlett-Packard.

The model HP8645 signal generator has calibration to provide an updated tuning voltage table (voltage vs. frequency) for the purpose of making frequency hopping applications. Calibration for the model HP8656 signal generator involves measuring and using a relationship between tuning voltage and frequency for obtaining a constant deviation when frequency modulation is used.

What is needed, therefore, and an object of the present invention, is a calibration procedure and calibration system for calibrating loop bandwidth of a frequency locked loop to optimize both settling time and modulation bandwidth

BRIEF SUMMARY OF THE INVENTION

A node of a communications network extracts a reference signal from a transport network for use as a reference signal for the node. The node comprises a frequency locked loop which filters the reference signal, as well as a calibration system which determines a tuning sensitivity factor for the frequency locked loop.

The frequency locked loop comprises a voltage controlled oscillator which generates an oscillator signal; a frequency detector which receives the reference signal and the oscillator signal; a processor which calculates a tuning correction signal; and, a digital to analog converter which converts the tuning correction signal to an analog tuning voltage for input to the voltage controlled oscillator.

The calibration system performs a calibration procedure which includes the calibration steps of (1) obtaining a first error measurement when a first voltage signal is utilized by the frequency locked loop; (2) obtaining a second error measurement when a second voltage signal is utilized by the frequency locked loop; and, (3) using the first error measurement and the second error measurement to determine a tuning sensitivity factor for the frequency locked loop.

In particular, a first tuning input data value (D1) is applied to the digital to analog converter to yield the first voltage signal value (V1); a second tuning input data value (D2) is applied to the digital to analog converter to yield the second voltage signal value (V2); the first error measurement is a first frequency error measurement (f1), and the second error measurement is a second frequency error measurement (f2). Determining the tuning sensitivity factor for the frequency locked loop involves determining a tuning slope by dividing a difference of the first frequency error measurement (f1) and the second frequency error measurement (f2) by a difference of the first tuning input data value (D1) and the second tuning input data value (D2).

In one embodiment, a filter circuit first receives the external reference signal and is connected to have its output signal (the filtered reference signal) applied to the frequency locked loop. The pre-filtering circuit aids in minimizing jitter and wander. Preferably the filter circuit is a phase locked loop, while the frequency locked loop is primarily digital in nature. In the calibration procedure, the extracted reference signal is disconnected from (not applied to) a phase detector of the filter circuit, and an oscillator of the filter circuit receives a stable tuning voltage so that the filter circuit outputs a stable and clean frequency reference signal to the frequency detector of the frequency locked loop.

In an example deployment, the communications node is a base station node of a cellular telecommunications system, such as a wide band code division multiple access (CDMA) network wherein the reference signal is applied to the base station node over an Asynchronous Transfer Mode (ATM) transport network.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well known devices, circuits, and methods are omitted so as not to obscure the description of the present invention with unnecessary detail.

Figure 1:
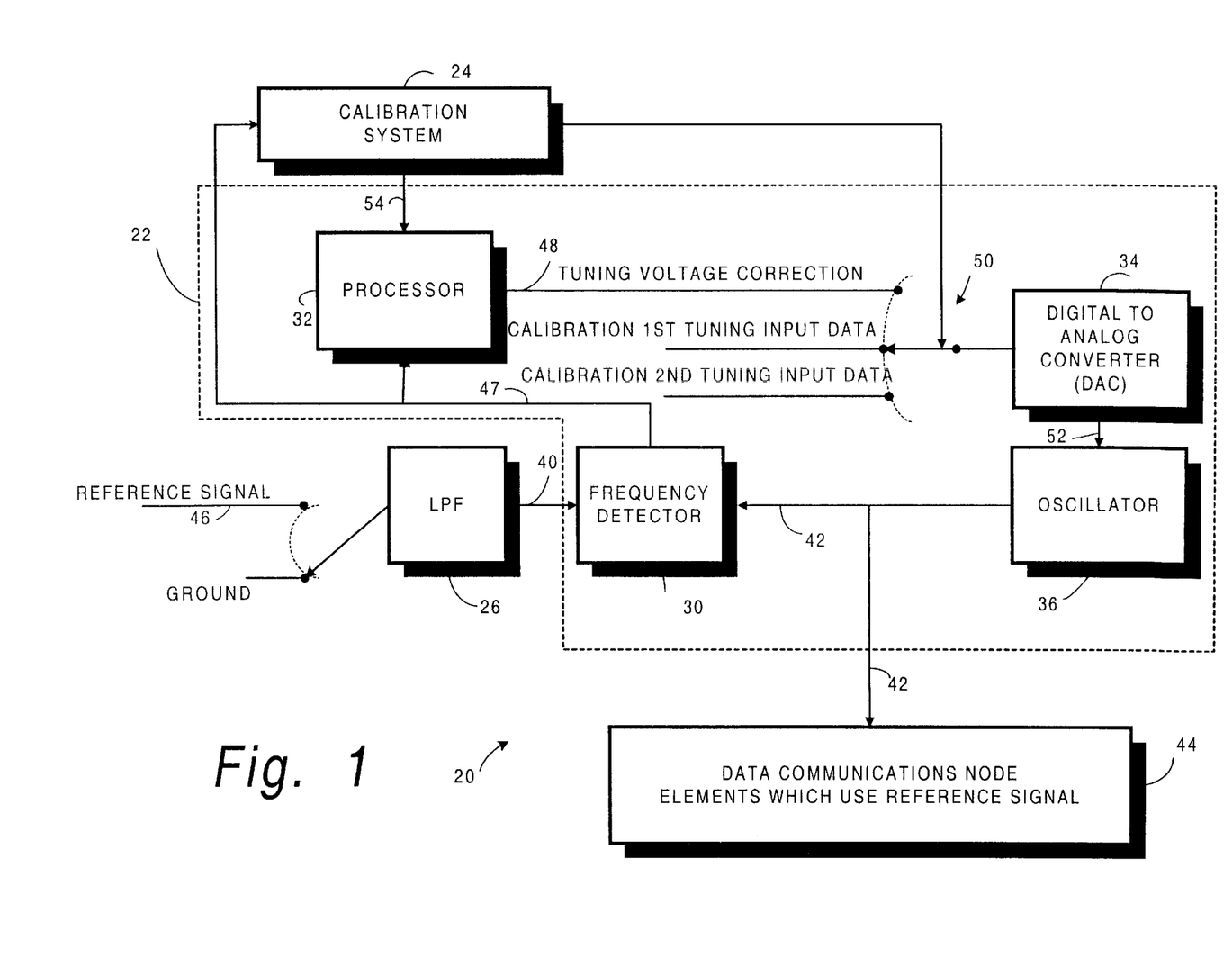
FIG. 1 is a schematic view of an example frequency locked loop with a calibration system according to one embodiment of the invention.

FIG. 1 shows a data communications node 20 which includes a frequency locked loop 22 and a calibration system 24 in accordance with an example embodiment of the present invention. A purpose of calibration system 24 is to perform a calibration (preferably automatic) of the loop bandwidth of frequency locked loop 22 by determining a tuning sensitivity factor for frequency locked loop 22. In a preferred example embodiment of the invention, a low pass filter (LPF) 26 is employed as a front end to frequency locked loop 22.

As constituent elements of one example of its internal structure, the frequency locked loop 22 of FIG. 1 is a digital loop comprising frequency detector 30, processor 32, digital to analog converter (DAC) 34, and oscillator 36. Inclusion of other elements within frequency locked loop 22 is within the scope of the invention, including connection of an amplifier (if necessary) between elements, such as between digital to analog converter (DAC) 34 and oscillator 36. Once calibrated, frequency locked loop 22 receives a signal on line 40 and outputs a node reference signal on node reference signal line 42 to other constituent elements of data communications node 20 which utilize the reference signal, those node elements being generally and collectively depicted as 44 in FIG. 1. In the embodiment in which the low pass filter 26 is employed, the low pass filter 26 receives an external reference signal on line 46 and applies its output signal on line 40 to frequency detector 30.

As shown in FIG. 1, frequency detector 30 has two inputs: a first input from low pass filter (LPF) 26 and a second input from oscillator 36 input applied on node reference signal line 42. The frequency detector 30 outputs an oscillator frequency error signal 47 to processor 32. The oscillator frequency error signal 47 is used by processor 32 to calculate a tuning voltage correction signal 48. After calibration, the tuning voltage correction signal 48 is applied to an input port of digital to analog converter (DAC) 34. The digital to analog converter (DAC) 34 then provides analog tuning voltage 52 to oscillator 36.

For sake only of illustrating steps involved in the calibration procedure of the resent invention, FIG. 1 shows a selector 50 connected between processor 32 and digital to analog converter (DAC) 34, with selector 50 choosing between one of three alternate values to be applied to digital to analog converter (DAC) 34. However, it should be understood that the connection between processor 32 and digital to analog converter (DAC) 34 is preferably one signal line which carries one of three values in accordance with the mode of operation. In the normal mode of operation (e.g., non-calibration operation), a tuning voltage correction value or signal 48 is applied to the input terminal of digital to analog converter (DAC) 34. In the calibration procedure, the input terminal of digital to analog converter (DAC) 34 is successively connected to receive a calibration first tuning input data value (D1) and a calibration second tuning input data value (D2). Since the calibration procedure is performed under control of calibration system 24, selector 50 is illustrated as being controlled by calibration system 24.

Figure 2:
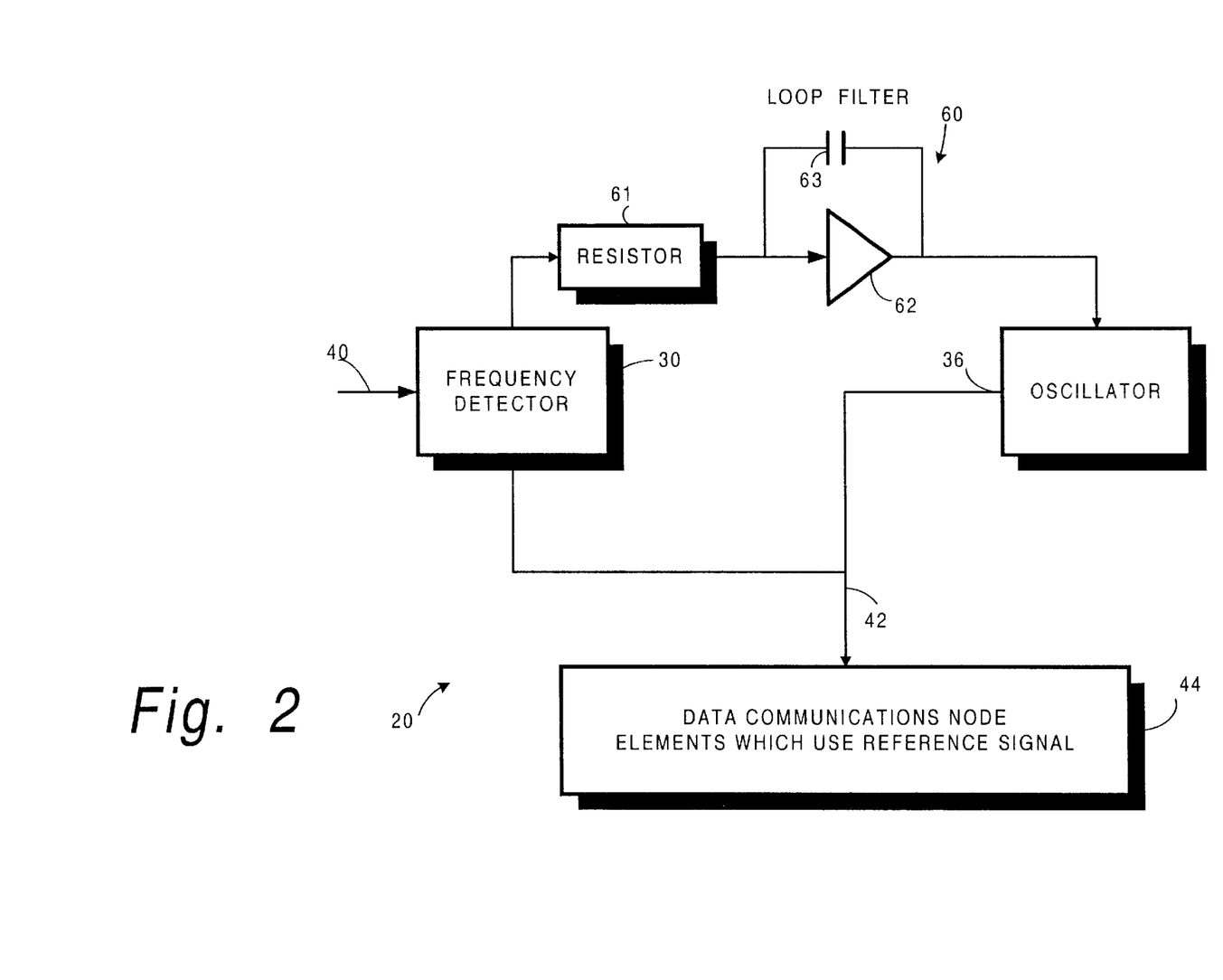
FIG. 2 is a schematic view of the frequency locked loop of FIG. 1, additionally depicting its low pass transfer function.

Various low pass transfer functions may be chosen for the digital loop of the frequency locked loop 22. In this regard, FIG. 2 depicts the low pass transfer function of frequency locked loop 22 (without its calibration system 24) as loop filter 60. Loop filter 60 comprises a resistor 61 feeding an amplifier 62, and a capacitor 63 connected around amplifier 62. The resistor 61, amplifier 62, and capacitor 63 form an integrator whose function can be implemented in software. Expressions and units for the gain of oscillator 36, frequency detector 30, and loop filter 60 are shown in Table 1.

TABLE 1

| PARAMETER | EXPRESSION | UNIT |
| --- | --- | --- |
| Oscillator Gain | a*Kvco | Hz/V |
| Detector Gain | 1/Kvco | V/Hz |
| Loop Filter Gain | 1/(s*T) | — |

In Table 1, the nominal gain for oscillator 36 is Kvco (in Hz/v). The factor a, e.g., known as the tuning sensitivity factor, is used for converting gain variations from sample to sample. The nominal value of a is 1. The factor s equals j*2*π*fm, where fm is the modulation frequency. The loop time constant is T, which can be determined by digital means.

The settling time response may be analyzed when a step input signal is applied. In the following analysis, E1 is assumed to be the frequency error at the beginning of a settling phase (ppm); E2 is assumed to be the frequency error at the end of the settling phase (ppm); and t is the settling time (in seconds). The settling time is estimated by using Equation 1.

$$E2 = E1 \times e^{(-t)/(T/a)} \qquad \text{Equation 1:}$$

Equation 1 can be rearranged to form Equation 2.

$$t = (T/a) \times \ln((E1)/(E2)) \qquad \text{Equation 2:}$$

The loop gain or transfer function H(s) is defined by Equation 3; the loop bandwidth BW (in Hz) is defined by Equation 4.

$$H(s) = 1/(1 + s \times (T/a)) \qquad \text{Equation 3:}$$

$$BW = 1/(2 \times \pi \times (T/a)) \qquad \text{Equation 4:}$$

In the foregoing equations, the tuning sensitivity factor "a" modifies the loop time constant. The tuning sensitivity factor a is, in fact, the single factor which is not precisely known. The tuning sensitivity factor a may vary over a considerable range, e.g., in one embodiment the factor a may vary from 0.4 to 2.5. Thus, the impact of tuning sensitivity factor a on settling time and attenuation of jitter and wander is substantial, as well as on other transfer functions.

The calibration system 24 of the present invention measures the tuning sensitivity of the oscillator 36 of frequency locked loop 22, thereby enabling a normalization of the tuning sensitivity factor a to 1 and determining precisely the loop bandwidth of frequency locked loop 22. The calibration system 24 performs a calibration procedure which is performed after power on for the data communications node 20, and thus calibrates the frequency locked loop 22.

Figure 1A:
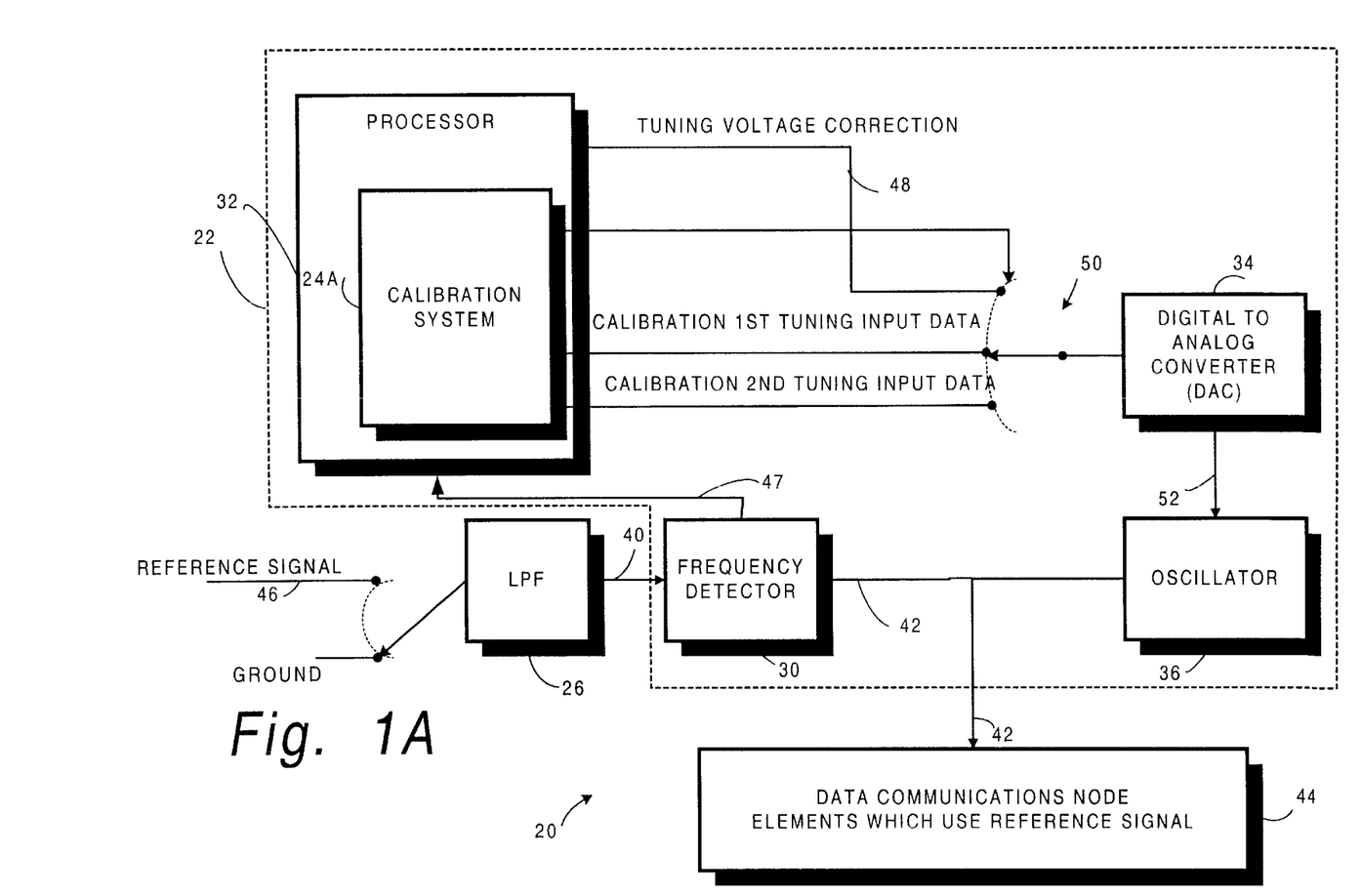
FIG. 1A is a schematic view of an example frequency locked loop with a calibration system according to another embodiment of the invention.

Whereas calibration system 24 is shown in the embodiment of FIG. 1 as being a distinct element in data communications node 20, it should be understood that the functions of calibration system 24 can be included in other elements of data communications node 20. For example, FIG. 1A shows an alternate embodiment in which calibration system 24A is included in processor 32. In other words, in the embodiment of FIG. 1A, processor 32 performs the functions of calibration system 24 as well as its normal processing functions.

Figure 8:
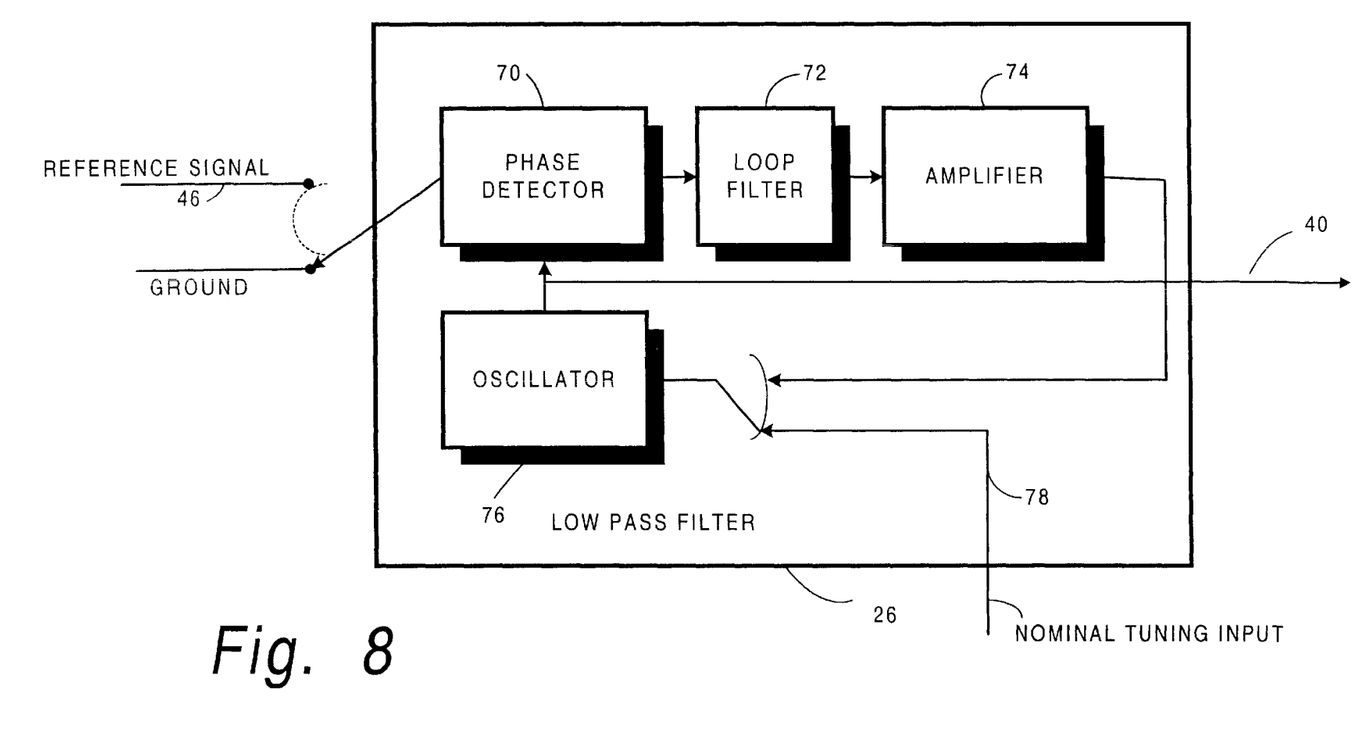
FIG. 8 is a schematic view of an example low pass filter utilizable example embodiments of the invention.

The measurement accuracy of the tuning sensitivity determination by calibration system 24 (or calibration system 24A) can be affected by a number of error sources, the most significant of which is a reference signal modulated by jitter and wander. As shown in FIG. 8, the low pass filter 26 is, in one example implementation, an analog phase locked loop which includes phase detector 70, loop filter 72, amplifier 74, and voltage-controlled oscillator 76. In normal operation, the input terminal of phase detector 70 is connected to the reference signal on line 46 and the input terminal of voltage-controlled oscillator 76 receives the output of amplifier 74. In the calibration procedure of the present invention, on the other hand, the input terminal of phase detector 70 is disconnected or connected to ground. In addition, in the calibration procedure, the input terminal of voltage-controlled oscillator 76 is connected to a nominal, clean tuning voltage input value (represented by line 78) which causes voltage-controlled oscillator 76 to operate a nominal frequency.

Figure 3:
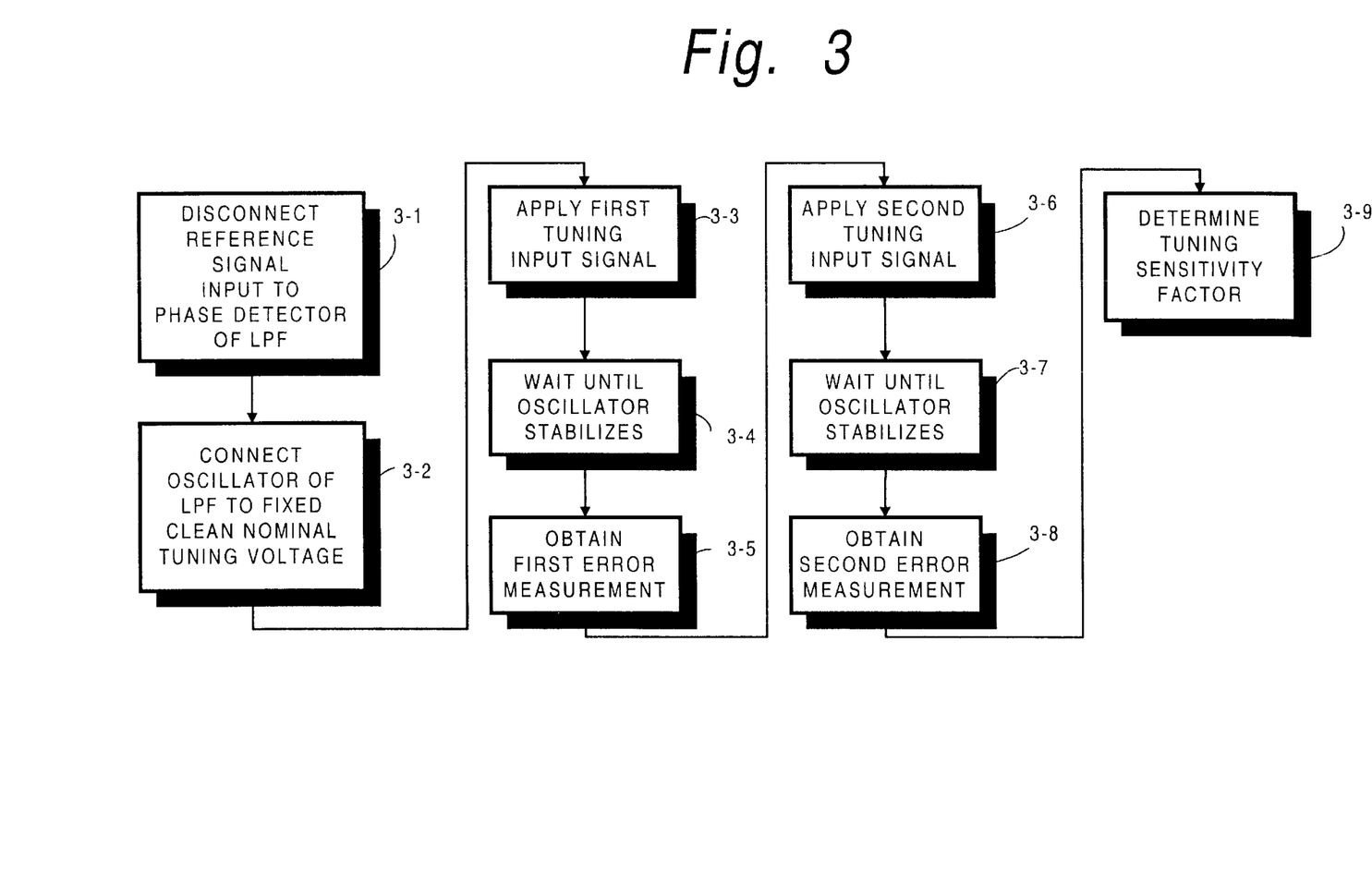
FIG. 3 is a flowchart showing basic example steps in accordance with a calibration method for a frequency locked loop.
Figure 4:
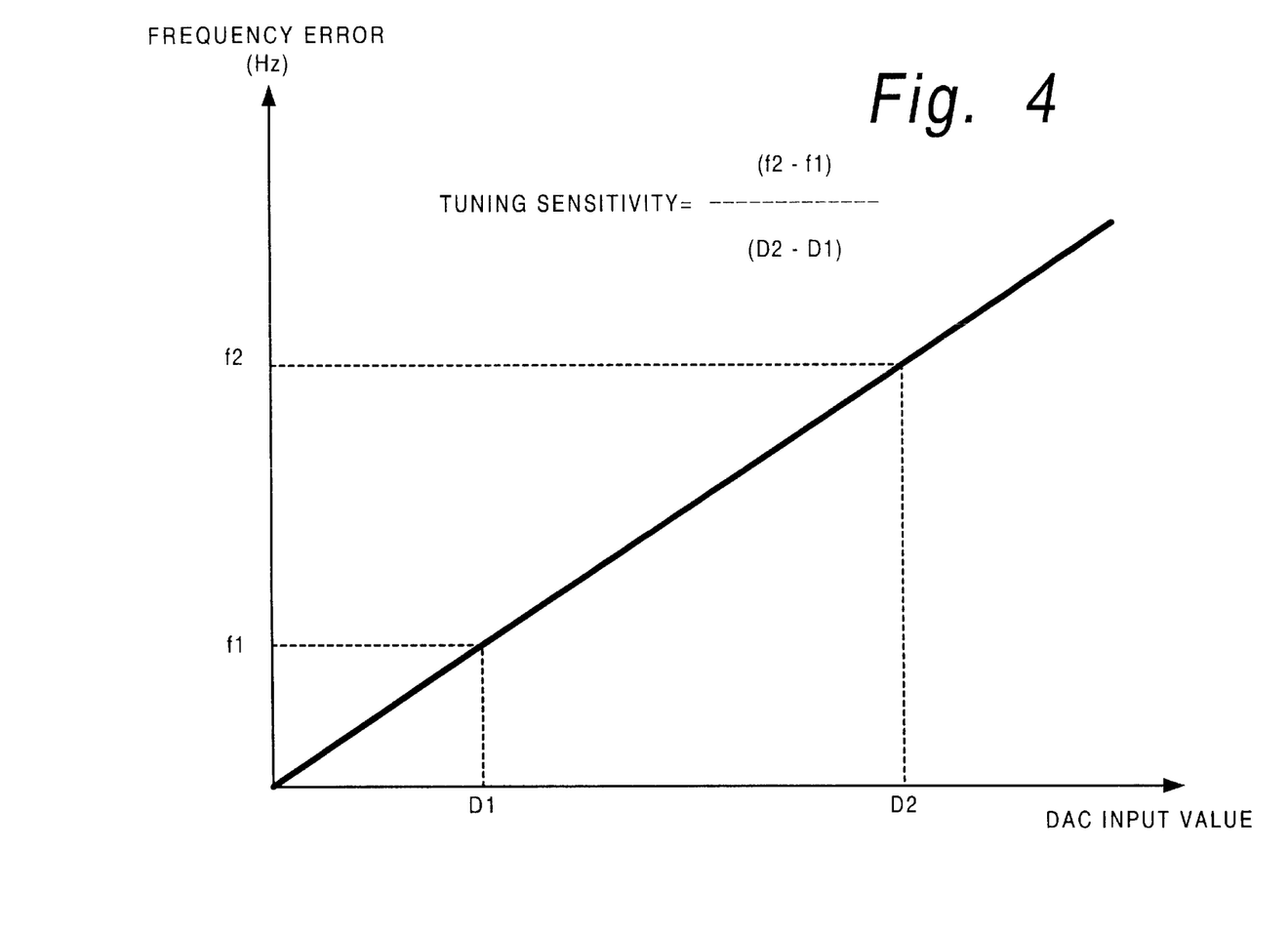
FIG. 4 is a graph showing determination of tuning sensitivity in accordance with a mode of the invention.

Example steps involved in the calibration procedure of the present invention are shown in FIG. 3, and understood, e.g., with reference to the frequency locked loop 22 and calibration system 24 of FIG. 1, as well as the graph of FIG. 4. In essence, the tuning sensitivity in Hz/bit of oscillator 36 of frequency locked loop 22 is determined by making error readings (e.g., frequency error readings) at two different tuning values (e.g., resulting in two different voltage input values being applied to oscillator 36). The reference signal to the frequency locked loop 22 is used as a reference for these measurements. A tuning curve, approximated by a straight line, results as shown in FIG. 4.

In accordance with step 3-1 of FIG. 3, the phase detector 70 is disconnected from external reference signal line 46 (e.g., the first input to phase detector 70 is connected to ground). Step 3-1 thus unlocks the loop of low pass filter 26, and thereby stops jitter and wander which otherwise would be present from the reference signal on line 46 and removes the low pass filtering action. In addition, as step 3-2, the input of voltage-controlled oscillator 76 is switched to be that of line 78, i.e., the fixed clean nominal tuning voltage. The output signal of voltage-controlled oscillator 76 can now be used as a reference signal on line 40 for frequency detector 30 during the entire calibration procedure.

As step 3-3, a first calibration tuning input signal is applied to frequency locked loop 22. In particular, as an illustration that differing inputs can be applied to digital to analog converter (DAC) 34, the selector 50 is operated to feed to digital to analog converter (DAC) 34 a calibration first tuning input signal or data value (D1). Upon receiving the calibration first tuning input data value (D1), digital to analog converter (DAC) 34 outputs a calibration first tuning voltage (VI) on line 52 to oscillator 36. Step 3-4 represents calibration system 24 waiting until oscillator 36 has stabilized after application of the first tuning voltage, e.g., 2.5 seconds in the example embodiment. Then, after oscillator stabilization, as step 3-5 a first error measurement, resulting from application of the calibration first tuning voltage (V1), is obtained from frequency locked loop 22. In the illustrated example, as step 3-5 a first frequency error measurement (f1) is obtained from frequency detector 30 (see oscillator frequency error signal 47 in FIG. 1).

As step 3-6, a second calibration tuning input signal or data value is applied to frequency locked loop 22. For the example embodiment of FIG. 1, as part of step 3-6 the selector 50 is now operated to feed to digital to analog converter (DAC) 34 a calibration second tuning input data value (D2). Again, it should be understood that selector 50 merely illustrates the application of differing input values to digital to analog converter (DAC) 34, which does not necessarily require a hardware selector element. Upon receiving the calibration second tuning input data value (D2), digital to analog converter (DAC) 34 outputs a calibration second tuning voltage (V2) on line 52 to oscillator 36.

In like manner as step 3-4, step 3-7 involves waiting until oscillator 36 has stabilized. After oscillator stabilization, as step 3-8 a second error measurement, resulting from application of the calibration second tuning voltage (V2), is obtained from frequency locked loop 22. In the illustrated example, as step 3-8 a second frequency error measurement (f2) is obtained from frequency detector 30.

As step 3-9, calibration system 24 determines a sensitivity tuning factor for the frequency locked loop. In the illustrated embodiment, step 3-9 involves determining a tuning slope by dividing a difference of the first frequency error measurement (f1) and the second frequency error measurement (f2) by a difference of the first tuning data value (D1) and the second tuning data value (D2), e.g., the tuning sensitivity as shown in Equation 5.

Equation 5: $$\text{Tuning Sensitivity} = (f2-f1)/(D2-D1).$$

In using the two points corresponding to the first tuning data value (D1) and the second tuning data value (D2), calibration system 24 assumes that the actual tuning curve (see FIG. 4) can be approximated by a straight line.

For the illustrated embodiment, the calibration procedure requires only about ten seconds to obtain a sufficient measurement resolution, providing measurement accuracy within about 3%.

After the calibration procedure has been performed, the external reference signal on line 46 becomes the effective input for low pass filter (LPF) 26 and thus a filtered input for frequency locked loop 22. Thereafter, the frequency locked loop 22 outputs the node reference signal on line 42 which can be used, e.g., as a clock signal for elements 44 of data communications node 20.

The bandwidth of low pass filter (LPF) 26 is at least a factor of two lower than the sampling rate of the frequency locked loop 22. The provision of low pass filter (LPF) 26 limits the deviation caused by jitter and wander to a reasonable amount.

Other factors of measurement error or uncertainty are believed to be negligible or controlled. For example, the measurement resolution amount is determined by the measurement time. Tuning voltage in frequency locked loop 22 is kept constant during the measurement. The measurements are made after the oscillator 36 in frequency locked loop 22 has stabilized to moot any oscillator drift in frequency locked loop 22. Likewise, when low pass filter (LPF) 26 is employed, the measurements are made after oscillator 72 has stabilized. One fixed tuning voltage is kept constant during its application. A frequency offset for oscillator 72 in low pass filter (LPF) 26 is kept constant, making any error contribution negligible.

During the calibration procedure of the present invention, the input on line 46 to phase detector 70 is turned off (or grounded) as explained with reference to step 3-1. Moreover, during the calibration procedure as step 3-2 the nominal tuning input voltage is applied on line 78 to voltage-controlled oscillator 76 in lieu of the output from low pass filter (LPF) 26 (e.g., in lieu of the output signal from amplifier 74). The selection of the proper inputs to one or more of phase detector 70 and voltage-controlled oscillator 76 during the calibration procedure can be automatically performed by calibration system 24, e.g., by the sending of appropriate control signals or the like to phase detector 70 and/or voltage-controlled oscillator 76 or gates which select inputs for phase detector 70 and voltage-controlled oscillator 76.

While variously illustrated embodiments show utilization of low pass filter (LPF) 26 in conjunction with the frequency locked loop 22, low pass filter (LPF) 26 need not be employed for all implementations. When the low pass filter (LPF) 26 is not used, another source should supply a clean and stable reference signal to the frequency locked loop (e.g., to frequency detector 30) during the calibration procedure.

Figure 5:
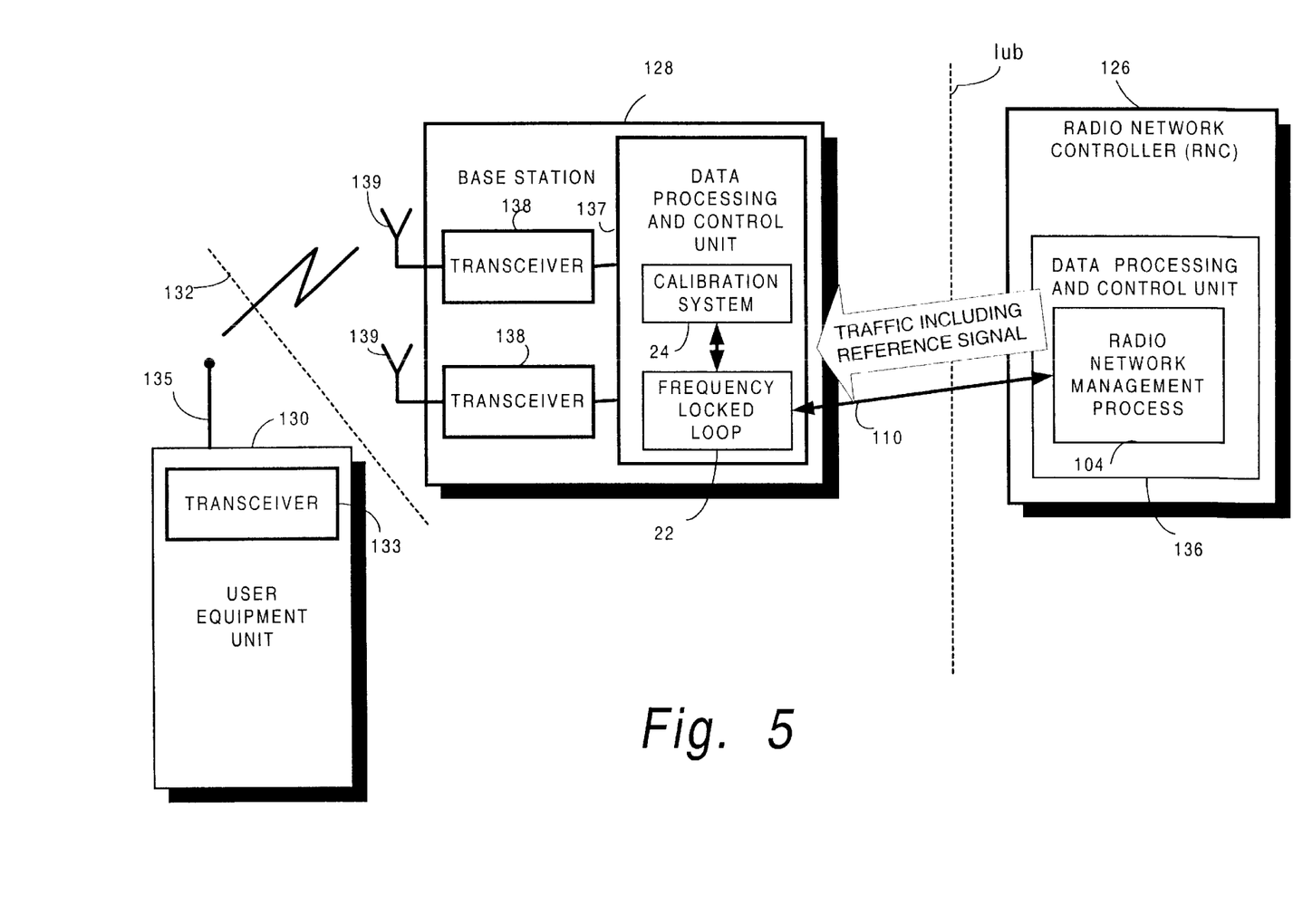
FIG. 5 is a simplified function block diagram of a portion of a UMTS Terrestrial Radio Access Network, including a base station which serves as an example data communications node in which the calibration system of the present invention can be deployed.

The calibration system 24 of the present invention can be deployed in a base station of a cellular telecommunications network as one non-limiting, example data communications node. As illustrated in FIG. 5, in the cellular telecommunications network a user equipment unit (UE), such as user equipment unit (UE) 130 communicates with one or more base stations (BS) 128 over a radio or air interface 132. The user equipment units (UEs) can be mobile stations such as mobile telephones ("cellular" telephones) and laptops with mobile termination, and thus can be, for example, portable, pocket, hand-held, computer-included, or car-mounted mobile devices which communicate voice and/or data with radio access network.

In the telecommunications network, a radio access network (RAN) covers a geographical area which is divided into cell areas, with each cell area being served by a base station 128. In the radio access network, several base stations 128 are typically connected (e.g., by landlines or microwave) to a radio network controller (RNC) 126. The radio network controller (RNC) 126, also sometimes termed a base station controller (BSC), supervises and coordinates various activities of the plural base stations connected thereto. The radio network controllers 126 are typically connected to one or more core networks.

One example of a radio access network is the Universal Mobile Telecommunications (UMTS) Terrestrial Radio Access Network (UTRAN). The UTRAN is a third generation system which in some respects builds upon the radio access technology known as Global System for Mobile communications (GSM) developed in Europe. UTRAN is essentially a wideband code division multiple access (W-CDMA) system.

FIG. 5 shows selected general aspects of illustrative nodes such as radio network controller 126 and base station 128, as well as a radio transceiver 133 of connected to an antenna 135 of user equipment unit (UE) 130. The example radio network controller 126 and base station 128 as shown in FIG. 5 are radio network nodes that include a corresponding data processing and control unit 136 and 137, respectively, for performing numerous radio and data processing operations required to conduct communications between the RNC 126 and the user equipment unit (UE) 130. Part of the equipment controlled by the base station data processing and control unit 137 includes plural radio transceivers 138 connected to one or more antennas 139.

In accordance with an example deployment of the present invention, the base station 128 serves as the data communications node at which the frequency locked loop 22 and calibration system 24 of the present invention. In particular, FIG. 5 shows the frequency locked loop 22 and calibration system 24 as comprising the base station data processing and control unit 137 of base station 128.

FIG. 5 also shows a link 110 which is part of a transport network over which traffic is transported between radio network controller 126 and base station 128. The traffic transported on link 110 includes a reference signal which is extracted at base station 128 and filtered by frequency locked loop 22 for use as the reference signal (e.g., clock) of the base station node. The frequency locked loop 22 of the base station 128 is calibrated using calibration system 24 in the manner above described, e.g., with reference to the steps of FIG. 3 and using the tuning sensitivity slope of FIG. 4.

Figure 6:
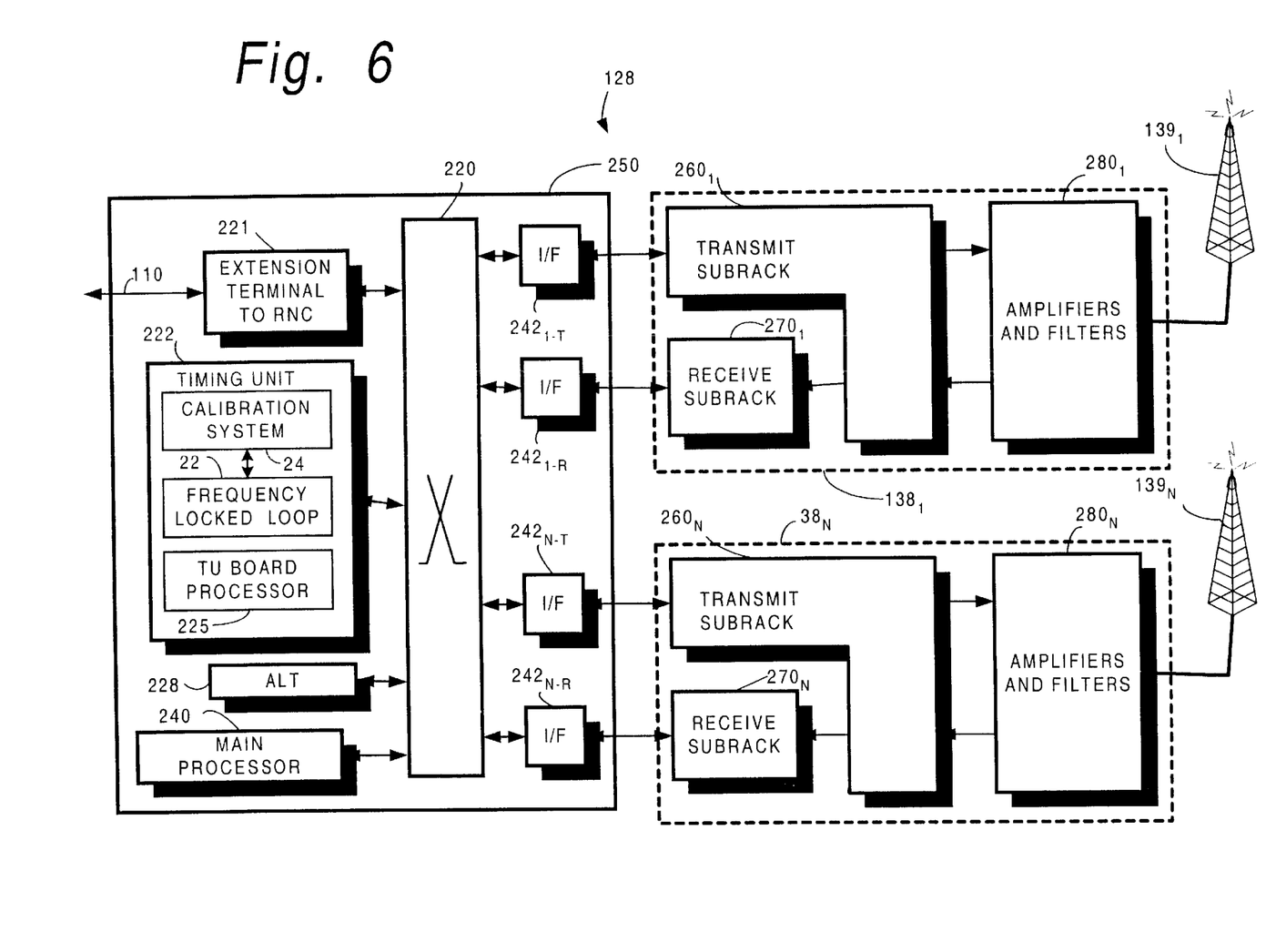
FIG. 6 is a schematic view showing further details of a base station node having an example deployment of the calibration system in accordance with one embodiment of the invention.

FIG. 6 shows in more detail a particular example embodiment of a base station 128 in which the calibration of the present invention can be deployed. It so happens that the base station (BS) node 128 of FIG. 6 is a switched-based node having a switch 220 which serves to interconnect various other constituent elements of base station (BS) node 128. Such other constituent elements include extension terminal 221; timing unit (TU) 222; ALT unit 228; BS main processor 240, and interface boards 242. The switch 220 transmits cells, e.g., ATM cells, between the various elements connected to switch 220.

Extension terminal 221 connects to link 110, and thus connects base station (BS) node 128 to radio network controller (RNC) node 126. ALT unit 228 is a unit which provides, e.g., multiplexing and demultiplexing and (optionally) queuing with regard to differing protocols of cells. The timing unit (TU) 222 includes the frequency locked loop 22 and calibration system 24 of the present invention, as well as, e.g., a timing unit board processor 225.

The embodiment of base station (BS) node 128 illustrated in FIG. 6 is housed in a rack having multiple subracks. Each subrack has one or more boards, e.g., circuit boards, mounted thereon. A first subrack 250 contains boards for each of extension terminal 221; timing unit (TU) 222; ALT unit 228; BS main processor 240, and interface boards 242. Each of the interface boards 242 is connected to another subrack, e.g., one of the transmitter subracks 260 or one of the receiver subracks 270. Each receiver subrack 270 is connected to share certain transmitter/receiver resources in a corresponding transmitter subrack 260, with the transmitter subrack 260 being connected to a corresponding one of amplifiers and filters subrack 280. The amplifiers and filters subrack 280 is connected to an appropriate antenna 139. For example, interface board $242_{1-T}$ is connected to transmitter subrack $260_1$, while interface board $242_{1-R}$ is connected to receiver subrack $270_1$. The pair of transmitter subrack $260_1$ and receiver subrack $270_1$ is, in turn, connected to amplifiers and filters subrack 280₁. Similar connections exist for a second pairing of transmitter subrack 260₂ and receiver subrack 270₂, which interface via interface board 242₂₋ₜ and interface board 242₂₋ᵣ, respectively. Each transceiver 38 of FIG. 5 thus comprises a transmitter subrack 260, a receiver subrack 270, and amplifiers and filters subrack 280.

In one example embodiment, base station (BS) node 128 is an ATM-based node, with interface boards 242 performing various ATM interfacing functions. The transmitter subracks 260 and receiver subracks 270 each include several boards. For example, each transmitter subrack 260 includes unillustrated elements such as a board for interfacing to its corresponding interface board 242; an encoder, a baseband transmitter. In addition, the transmitter subrack 260 includes the transmitter/receiver sources which it shares with receiver subrack 270, including a radio frequency transmitter. Each receiver subrack 270 includes unillustrated elements such as a board for interfacing to its corresponding interface board 242; a decoder, and a baseband receiver. Each amplifiers and filters subrack 280 includes amplifiers, such as MCPA and LNA amplifiers.

Figure 7:
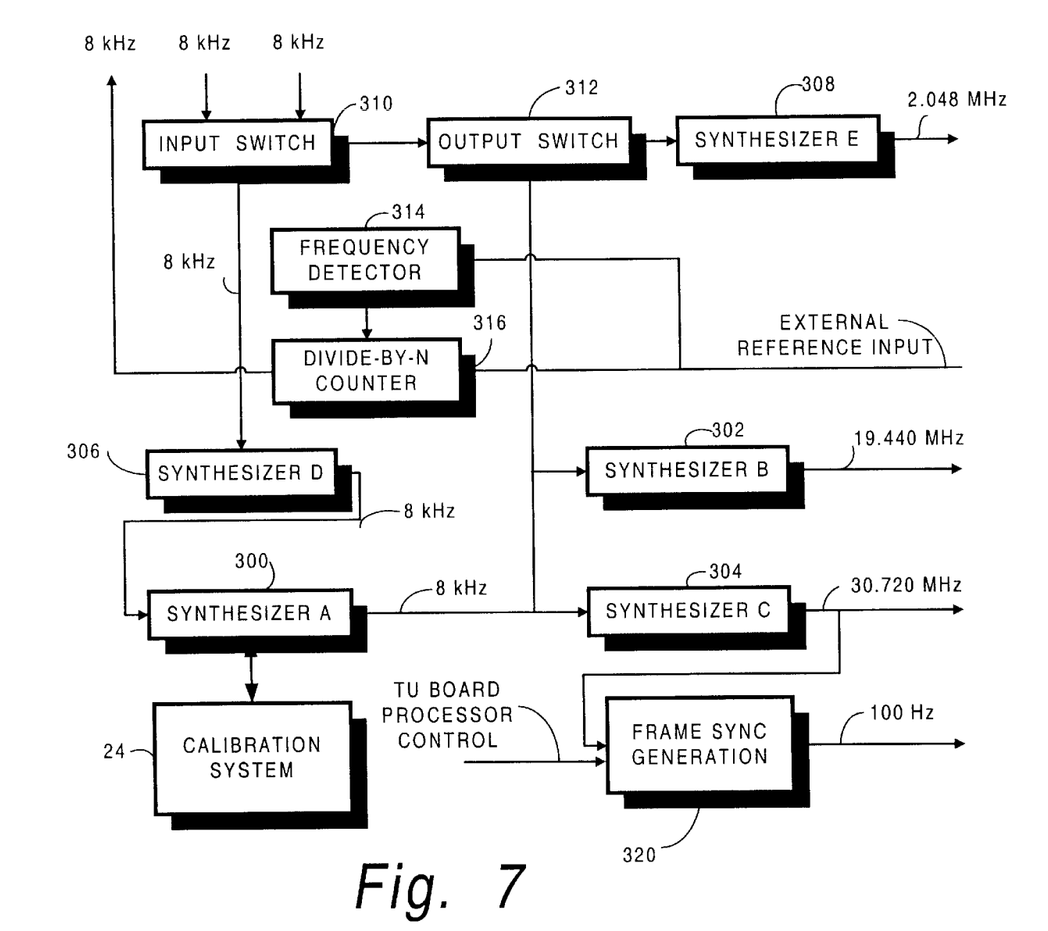
FIG. 7 is a schematic view of an example timing unit included in a base station node having an example deployment of the calibration system in accordance with one embodiment of the invention.

Yet further details of portions of an example timing unit (TU) 222 are illustrated in FIG. 7. The timing unit (TU) includes five synthesizers: synthesizer A (also labeled synthesizer 300); synthesizer B (also labeled synthesizer 302); synthesizer C (also labeled synthesizer 304); synthesizer D (also labeled synthesizer 306); and, synthesizer E (also labeled synthesizer 308). Two input terminals of an input switch 310 each receive 8 kHz signals. An output terminal of input switch 310 outputs 8 kHz signals both to synthesizer D and to a first input terminal of output switch 312. An external reference signal is obtained from external equipment and applied to frequency detector 314 and to a divide-by-N counter 316. The divide-by-N counter 316 generates a 8 kHz signal which is routed to a switch on another board and thereafter returned to timing unit (TU) 222 as one of the 8 kHz input signals to input switch 310.

The synthesizer D outputs a 8 kHz signal to synthesizer A, which in turn outputs a 8 kHz signal to each of a second terminal of output switch 312; to synthesizer B; and to synthesizer C. The synthesizer B outputs a 19.440 MHz signal which serves as the ATM reference signal of base station 128. The synthesizer C outputs a 30.720 MHz signal which serves as the base band reference signal of base station 128. In addition, the 30.720 MHz signal output by synthesizer C is applied to a first input terminal of a frame sync generator 320. A second input terminal of frame sync generator 320 receives a control signal from timing unit board processor 225 (see FIG. 6). An output terminal of output switch 312 is connected to an input terminal of synthesizer E, with synthesizer E outputting a 2.048 MHz signal which serves as a source for optional external equipment.

Briefly referring to other elements of FIG. 7, input switch 310 selects either of two input signals. Output switch 312 selects either of two input signals for application to synthesizer E, one input signal being unfiltered (from input switch 310) and the other being filter (from synthesizer A). The synthesizer E provides a 2.048 MHz output signal which may be used as a reference signal by optional external equipment. Frequency detector 314 detects an input frequency signal, and controls a controllable divide ratio of divide-by-N counter 316 such that the output frequency of divide ratio of divide-by-N counter 316 is 8 kHz.

In the embodiment of base station 128 illustrated in FIG. 6 with its timing unit (TU) 222 illustrated in FIG. 7, an 8 kHz reference signal is extracted by the extension terminal 221 from the ATM traffic carried over link 110. The 8 kHz reference signal extracted by the extension terminal 221 is applied to input switch 310, which directs the extracted 8 kHz reference signal to synthesizer D.

Synthesizer D serves to perform the functions of low pass filter (LPF) 26. The 8 kHz signal output from synthesizer D is applied to synthesizer A, which serves as the frequency locked loop 22 of the present invention.

In serving as the frequency locked loop 22, the synthesizer A is digital in nature and has components corresponding to the frequency detector 30, processor 32, digital to analog converter (DAC) 34, and oscillator 36 previously described. The oscillator 36 of synthesizer A is an oven controlled crystal oscillator which has a fairly wide tuning range, thereby facilitating provision of the crystal oscillator by plural suppliers. But, as mentioned before, the tuning sensitivity of the crystal oscillator 36 of synthesizer A affects the bandwidth of the frequency locked loop of synthesizer A, thus creating the need for the calibration system 24 of the present invention.

The synthesizer A has a slow bandwidth, and tracks the average frequency of the incoming signal applied thereto by synthesizer D. The synthesizer A has a sampling rate of 4 Hz. The synthesizer D is a low pass filter with a bandwidth even slower than the sampling rate of synthesizer A. The output of synthesizer A is applied, e.g., to synthesizer B and to synthesizer C. As mentioned above, the synthesizer B outputs the 19.440 MHz ATM reference signal while synthesizer C outputs the 30.720 MHz base band signal. The 30.720 MHz base band signal is used by frame sync generator 320 to create signal frames, e.g., system frame numbers.

The loop bandwidth of synthesizer A (e.g., frequency locked loop 22) may vary by a factor of 2.2, which adversely affects the settling time of frequency locked loop 22. As mentioned previously, it is desirable to control both the settling time and the jitter and wander of frequency locked loop 22. Controlling settling time is particularly important in the case that the base station 128 has a cascaded structure. The calibration system 24 of the present invention, and the calibration procedure described herein performed at start up of the base station 128, allows the control of both settling time and jitter and wander for the base station as above described, e.g., in connection with the steps of FIG. 3 and the tuning sensitivity slope determination of FIG. 4.

Figure 6A:
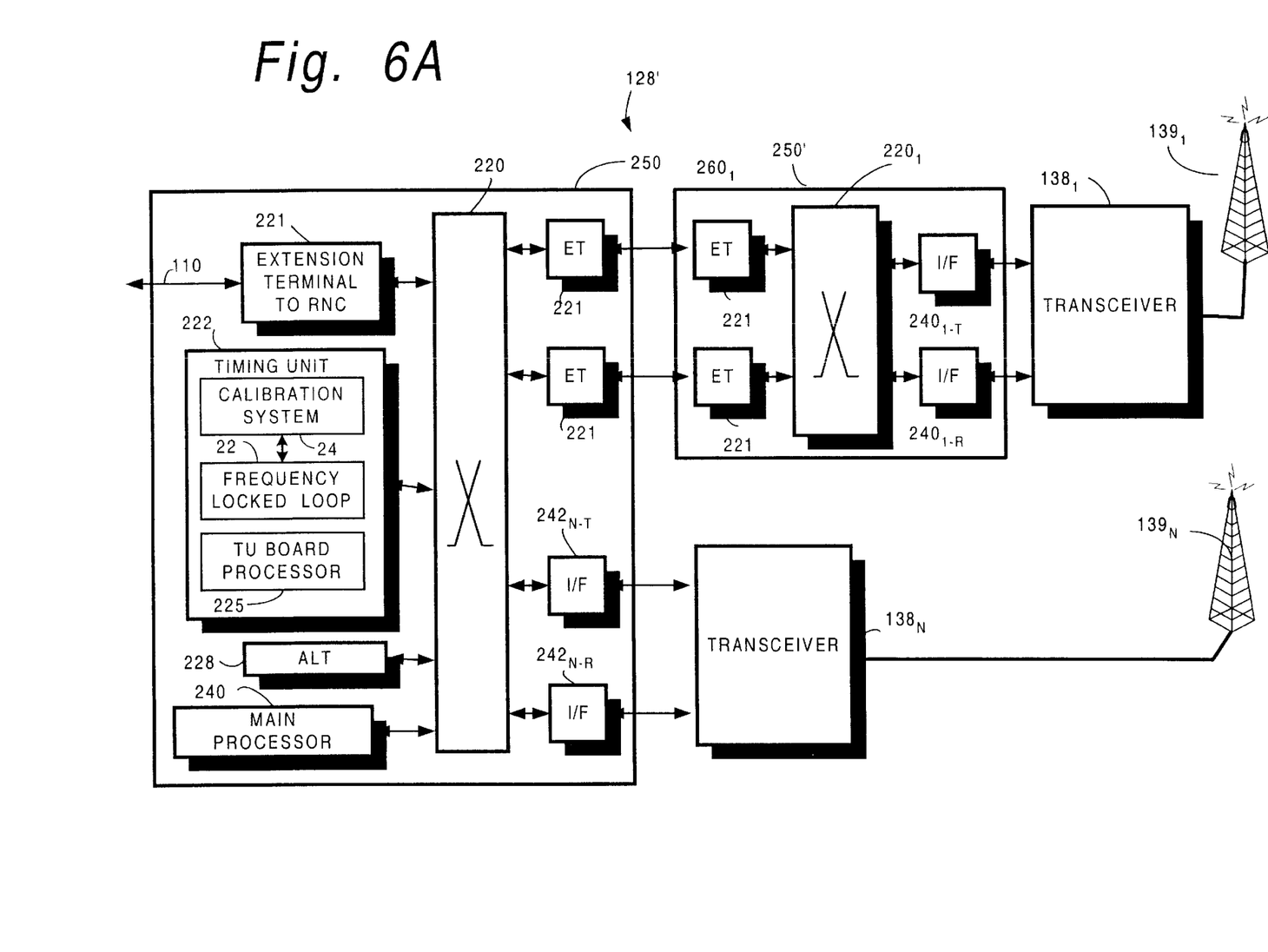
FIG. 6A is a schematic view of a cascaded base station node having an example deployment of the calibration system in accordance with another embodiment of the invention.

An example of cascaded structure for a base station 128' is illustrated in FIG. 6A. The cascaded base station 128' of FIG. 6A resembles that of FIG. 6, but differs, e.g., by having its transceiver 138₁ connected via a second subrack 250' to the subrack 250. The second subrack 250' has its own switch 220₁, which connects via extension terminals (ETs) 221 to the switch 220 of subrack 220.

The present invention allows a change in the setting of the digital to analog converter (DAC) 34 in order to track the input frequency, since the input frequency may change because of drift, for example. Using the tuning sensitivity factor of the present invention, determined using calibration system 24 and the calibration procedure herein described, provides a way of knowing by how much the setting of the digital to analog converter (DAC) 34 should be changed.

Recalling Equation 4, BW=1/(2×π×(T/a)), the quantity (T/a) represents the time loop constant. Since the present invention provides a way of accurately knowing the tuning sensitivity factor "a", and thus accurately knowing the oscillator gain Hz/bit), accurate corrections can be performed.

In the illustrated embodiments, the oscillator 36 is a 10.000 MHz crystal oscillator. The oscillator 36 employed by frequency locked loop 22 will change with age. However, the age-caused changes in oscillator 36 will be offset and controlled by the feedback loop of frequency locked loop 22.

Thus, the present invention provides a calibration procedure and calibration system for calibrating loop bandwidth of a frequency locked loop, which system and procedure optimizes settling time and modulation bandwidth. In addition, the dedicated calibration circuitry hardware is very inexpensive.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of calibrating a frequency locked loop which is to filter an extracted reference signal from a transport network for use as a reference signal for a node of a communications network, the method comprising:

(1) applying a first tuning data value to the frequency locked loop;

(2) obtaining a first error measurement resulting from step (1);

(3) applying a second tuning data value to the frequency locked loop;

(4) obtaining a second error measurement resulting from step (3);

(5) using the first error measurement and the second error measurement to determine a tuning sensitivity factor for the frequency locked loop.

2. The method of claim 1, further comprising:

applying the first tuning input data value to a digital to analog converter which comprises the frequency locked loop to yield a first voltage signal;

applying the first voltage signal to a voltage controlled oscillator comprising the frequency locked loop to generate a first frequency;

applying the second tuning input data value to the digital to analog converter to yield a second voltage signal;

applying the second voltage signal to the voltage controlled oscillator to generate a second frequency;

wherein the first error measurement is a first frequency error measurement generated by a frequency detector comprising the phase locked loop, the first frequency error measurement being a difference between the first frequency and a reference frequency; and;

the second error measurement is a second frequency error measurement generated by the frequency detector, the second frequency error measurement being a difference between the second frequency and the reference frequency.

3. The method of claim 1, wherein the step of determining the tuning sensitivity factor for the frequency locked loop involves determining a tuning slope by dividing a difference of the first error measurement and the second error measurement by a difference of the first tuning data value and the second tuning data value.

4. The method of claim 1, wherein the frequency locked loop comprises a frequency detector, and wherein the method further comprises the frequency detector receiving a stable reference frequency signal as a first input and an output of the voltage controlled oscillator as a second input.

5. The method of claim 1, wherein the method further comprises a frequency detector comprising the phase locked loop receiving a stable reference frequency signal from a filter circuit, and wherein the filter circuit is an analog low pass filter and the frequency locked loop is a digital circuit.

6. A method of calibrating a frequency locked loop which is to filter an extracted reference signal from a transport network for use as a reference signal for a node of a communications network, the method comprising:

(1) applying a first voltage signal to the voltage controlled oscillator;

(2) obtaining a first error measurement resulting from step (1);

(3) applying a second voltage signal to the voltage controlled oscillator;

(4) obtaining a second error measurement resulting from step (3);

(5) using the first error measurement and the second error measurement to determine a tuning sensitivity factor for the frequency locked loop.

7. A node of a communications network which filters an extracted reference signal from a transport network for use as a reference signal for the node, the node comprising:

a frequency locked loop;

a calibration system which determines a tuning sensitivity factor for the frequency locked loop by performing the following calibration steps of:

(1) obtaining a first error measurement when a first tuning data value is applied to the frequency locked loop;

(2) obtaining a second error measurement when a second tuning data value is applied to the frequency locked loop;

(3) using the first error measurement and the second error measurement to determine the tuning sensitivity factor for the frequency locked loop.

8. The apparatus of claim 7, wherein the frequency locked loop comprises a digital to analog converter to which the first tuning input data value and the second tuning input data value are successively applied to result in respective generation of a first voltage signal and a second voltage signal;

a voltage controlled oscillator to which the first voltage signal and the second voltage signal are successively applied to result in a first frequency value and a second frequency value;

a frequency detector which generates the first frequency error measurement by taking a difference between the first frequency and a reference frequency; and which generates the second error measurement by taking a difference between the second frequency and the reference frequency.

9. The apparatus of claim 7, wherein determining the tuning sensitivity factor for the frequency locked loop involves determining a tuning slope by dividing a difference of the first error measurement and the second error measurement by a difference of the first tuning data value and the second tuning data value.

10. The apparatus of claim 7, wherein the frequency locked loop further comprises a frequency detector which receives a stable reference frequency signal from a filter circuit as a first input and an output of a voltage controlled oscillator as a second input.

11. The apparatus of claim 10, wherein the stable reference frequency signal is received from a filter circuit, and wherein the filter circuit is an analog low pass filter and the frequency locked loop is a digital circuit.

12. The apparatus of claim 7, wherein the calibration system comprises a processor which performs at least calibration step (3).

13. The apparatus of claim 7, wherein the frequency locked loop comprises:

the voltage controlled oscillator which generates an oscillator signal;

a frequency detector which receives a reference signal and the oscillator signal;

a processor which calculates a tuning correction signal;

a digital to analog converter which converts the tuning correction signal to an analog tuning voltage for input to the oscillator.

14. The apparatus of claim 13, wherein the processor also performs at least calibration step (3).

15. The apparatus of claim 7, wherein the node is a base station node of a cellular telecommunications system.

16. The apparatus of claim 15, wherein the reference signal is applied to the base station node over an Asynchronous Transfer Mode (ATM) transport network.

* * * * *